(12) United States Patent
Armstrong et al.

(10) Patent No.: US 11,795,541 B2
(45) Date of Patent: Oct. 24, 2023

(54) METHOD OF COOLING A DEPOSITION SOURCE, CHAMBER FOR COOLING A DEPOSITION SOURCE AND DEPOSITION SYSTEM

(71) Applicant: Applied Materials, Inc., Santa Clara, CA (US)

(72) Inventors: Claire Armstrong, Gummersbach (DE); Frank Schnappenberger, Johannesberg (DE); Thomas Deppisch, Aschaffenburg (DE)

(73) Assignee: Applied Materials, Inc., Santa Clara, CA (US)

( * ) Notice: Subject to any disclaimer, the term of this patent is extended or adjusted under 35 U.S.C. 154(b) by 47 days.

(21) Appl. No.: 16/759,696

(22) PCT Filed: Nov. 16, 2017

(86) PCT No.: PCT/EP2017/079474
§ 371 (c)(1),
(2) Date: Apr. 27, 2020

(87) PCT Pub. No.: WO2019/096392
PCT Pub. Date: May 23, 2019

(65) Prior Publication Data
US 2020/0332413 A1    Oct. 22, 2020

(51) Int. Cl.
*C23C 14/54* (2006.01)
*C23C 14/24* (2006.01)

(52) U.S. Cl.
CPC ............ *C23C 14/54* (2013.01); *C23C 14/243* (2013.01)

(58) Field of Classification Search
CPC .................................................. C23C 14/243
See application file for complete search history.

(56) References Cited

U.S. PATENT DOCUMENTS 5,834,068 A * 11/1998 Chern ................... C23C 16/52
427/535
6,296,894 B1 10/2001 Tanabe et al.
(Continued)

FOREIGN PATENT DOCUMENTS

JP    2000012218 A    1/2000
JP    2017197824 A  * 11/2017
(Continued)

OTHER PUBLICATIONS

JP2017197824A, 2017. Machine Translation. (Year: 2017).*
(Continued)

*Primary Examiner* — Robert A Vetere
(74) *Attorney, Agent, or Firm* — Patterson + Sheridan, LLP

(57) ABSTRACT

A method (100) of cooling a deposition source (200) is described. The method includes stopping (110) depositing material from the deposition source, the deposition source being arranged in a deposition chamber (250), and introducing (120) a cooling gas into the deposition chamber (250), the cooling gas comprising a thermal conductivity $\lambda$ of $\lambda \geq 0.05$ [W/(m*K)]. Further, a chamber for cooling a deposition source is described. The chamber includes a deposition source being arranged in the chamber. Further, the chamber includes a cooling gas supply system configured for providing a cooling gas into the chamber, the cooling gas comprising a thermal conductivity $\lambda$ of $\lambda \geq 0.05$ [W/(m*K)].

9 Claims, 4 Drawing Sheets

(56) References Cited

U.S. PATENT DOCUMENTS

| | | | |
|---|---|---|---|
| 2001/0008121 A1 | 7/2001 | Tanabe et al. | |
| 2009/0061079 A1* | 3/2009 | Konishiike | H01M 4/1395 |
| | | | 427/78 |
| 2014/0165913 A1 | 6/2014 | Choi | |
| 2017/0092899 A1* | 3/2017 | Bangert | C23C 14/26 |
| 2017/0214892 A1* | 7/2017 | Nagatani | H04N 9/3155 |

FOREIGN PATENT DOCUMENTS

| | | |
|---|---|---|
| JP | 2017197824 A | 11/2017 |
| KR | 20140078284 A | 6/2014 |

OTHER PUBLICATIONS

JP 2017197824A, machine translation. (Year: 2017).*
Ganta et al., "Optical method for measuring thermal accommodation coefficients using a whispering-gallery microresonator," 2011, J Chem. Phys. 135, p. 084313. (Year: 2011).*
International Search Report and Wrtten Opinion dated Aug. 7, 2018 for International Application No. PCT/EP2017/079474.
European Patent Application No. 17798227.9, Communication and Search Report, dated May 16, 2022, 4 pages.
Chinese Application No. 201780096814.1, Second Office Action dated Aug. 1, 2022, 18 pages.
Chinese Application No. 201780096814.1, Office Action and Search Report dated Mar. 17, 2022, 15 pages.
Korean Patent Application No. 10-2020-7015942, Office Action dated Mar. 10, 2022, 8 pages.

* cited by examiner

METHOD OF COOLING A DEPOSITION SOURCE, CHAMBER FOR COOLING A DEPOSITION SOURCE AND DEPOSITION SYSTEM

TECHNICAL FIELD

Embodiments of the disclosure relate to cooling of deposition sources, particularly to methods, chambers and systems for cooling deposition sources. In particular, embodiments of the disclosure relate to methods, chambers and systems for cooling deposition sources for depositing evaporated material on a substrate, particularly for OLED manufacturing.

BACKGROUND

Organic evaporators are a tool for the production of organic light-emitting diodes (OLED). OLEDs are a special type of light-emitting diode in which the emissive layer comprises a thin-film of certain organic compounds. Organic light emitting diodes (OLEDs) are used in the manufacture of television screens, computer monitors, mobile phones, other hand-held devices, e.g. for displaying information. OLEDs can also be used for general space illumination. The range of colors, brightness and viewing angles of OLED displays may be greater than that of traditional LCD displays because OLED pixels directly emit light and do not involve a back light. Therefore, the energy consumption of OLED displays is considerably less than that of traditional LCD displays. Further, the fact that OLEDs can be manufactured onto flexible substrates results in further applications.

Typically, the evaporated material is directed toward the substrate by one or more outlets of a vapor source. For example, the vapor source may be provided with a plurality of nozzles that are configured for directing plumes of evaporated material toward the substrate. The vapor source may be moved relative to the substrate for coating the substrate with the evaporated material.

Typically, the operation temperature of deposition sources for depositing evaporated material on a substrate can be as high as 600° C. For maintenance, service or exchange of the deposition source, the deposition chamber has to be vented with air and opened to the environment. Therefore, the deposition source has to be cooled, for instance to a temperature of below 100° C. The time needed for cooling the deposition source from the operation temperature to 100° C. or below directly affects the available production time of the deposition source.

Thus, in view of the above, there is a continuous demand for improved methods, chambers and systems for cooling deposition sources with which the downtime of production can be reduced.

SUMMARY

In light of the above, a method of cooling a deposition source, a chamber for cooling a deposition source, and a deposition system according to the independent claims are provided. Further aspects, advantages, and features are apparent from the dependent claims, the description, and the accompanying drawings.

According to an aspect of the present disclosure, a method of cooling a deposition source is provided. The method includes stopping depositing material from the deposition source, the deposition source being arranged in a deposition chamber. Further, the method includes introducing a cooling gas into the deposition chamber, the cooling gas comprising a thermal conductivity $\lambda$ of $\lambda \geq 0.05$ [W/(m*K)].

According to a further aspect of the present disclosure, a method of cooling an evaporation source is provided, the evaporation source being provided in a deposition chamber. The method includes switching off a crucible heater of a crucible configured for evaporating material. Further, the method includes maintaining a heating of a distribution assembly of the evaporation source until material evaporation has stopped, the distribution assembly being in fluid communication with the crucible. Additionally, the method includes introducing a cooling gas into the deposition chamber at a pressure p of 1 mbar$\leq$p$\leq$100 mbar, the cooling gas comprising a thermal conductivity $\lambda$ of $\lambda \geq 0.05$ [W/(m*K)], and providing the cooling gas into a free space between the distribution assembly and a shield arrangement. The shield arrangement is arranged at a distance D to the distribution assembly for providing the free space. Further, the method includes cooling the shield arrangement by using a cooling system being in contact with the shield arrangement.

According to another aspect of the present disclosure, a chamber for cooling a deposition source is provided. The chamber includes a deposition source being arranged in the chamber for cooling the deposition source. Further, the chamber includes a cooling gas supply system configured for providing a cooling gas into the chamber for cooling the deposition source, the cooling gas comprising a thermal conductivity $\lambda$ of $\lambda \geq 0.05$ [W/(m*K)].

According to a further aspect of the present disclosure, a deposition system for depositing a layer on a substrate is provided. The deposition system includes a chamber for cooling a deposition source according to any embodiments described herein.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus. The methods for operating the described apparatus include method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION OF EMBODIMENTS

Reference will now be made in detail to the various embodiments of the disclosure, one or more examples of which are illustrated in the figures. Within the following description of the drawings, the same reference numbers refer to same components. Only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

Figure 1:
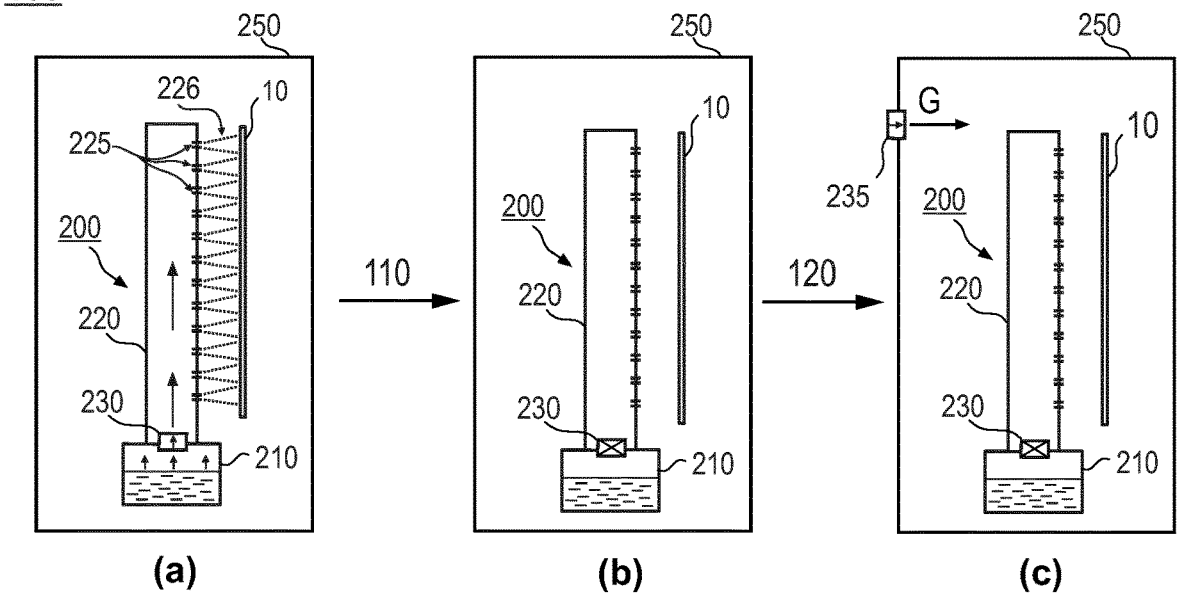
FIG. 1 shows a schematic representation of a method of cooling a deposition source according to embodiments described herein.

With exemplary reference to FIG. 1, a method 100 of cooling a deposition source 200 according to the present disclosure is described.

In particular, FIG. 1 shows a deposition source 200 arranged in a deposition chamber 250. The deposition source 200 includes a crucible 210, particularly an evaporation crucible. The evaporation crucible is configured to evaporate a material to be deposited on a substrate. Further, the deposition source 200 includes a distribution assembly 220 with one or more outlets 225. For instance, the one or more outlets 225 may be nozzles. As exemplarily indicated in FIG. 1(*a*), typically the nozzles are configured for directing a plume 226 of evaporated material towards the substrate 10. As exemplarily shown in FIG. 1(*a*), the distribution assembly 220 is in fluid communication with the crucible 210. For example, the deposition source 200 may include a valve 230 configured to control a flow of the evaporated material from the crucible 210 to the distribution assembly 220. For instance, the valve can be closed in order to stop a flow of evaporated material from the crucible to the distribution assembly.

As exemplarily indicated by arrow 110 in FIG. 1, according to embodiments which can be combined with any other embodiments described herein, the method 100 includes stopping (arrow 110) depositing material from the deposition source 200. For example, as exemplarily indicated in FIG. 1(*b*), stopping depositing material from the deposition source may include closing the valve in order to stop a flow from the crucible 210 to the distribution assembly 220. Further, stopping depositing material from the deposition source can include switching a crucible heater of the crucible.

Further, as exemplarily indicated by arrow 120 in FIG. 1, the method 100 includes introducing (arrow 120) a cooling gas G into the deposition chamber 250. For instance, the cooling gas G can be introduced into the deposition chamber via a further valve 235 provided in a wall of the deposition chamber 250, as exemplarily shown in FIG. 1(*c*). The cooling gas includes a thermal conductivity λ of $\lambda \geq 0.05$ [W/(m*K)].

Accordingly, the embodiments of the method of cooling a deposition source of the present disclosure beneficially provide for a reduction of cooling time for cooling a deposition from operation temperature to a temperature of approximately 100° C. Thus, embodiments of the present disclosure have the advantage that the downtime of production can be reduced. In particular, compared to conventional cooling methods employed for cooling a deposition source, the embodiments described herein are capable of providing a cooling time of 1 hour or less for cooling from an operation temperature of 500° C. to 600° C. down to a temperature of approximately 100° C. In contrast thereto, with conventional cooling methods the cooling time from an operation temperature of 500° C. to 600° C. down to a temperature of approximately 100° C. is around 8 hours. Accordingly, embodiments of the method of cooling a deposition source as described herein provide for a significant reduction in cooling time compared to conventionally known methods.

In the present disclosure, a "cooling gas" can be understood as a gas having a thermal conductivity λ of $\lambda \geq 0.05$ [W/(m*K)]. In the present disclosure, the thermal conductivity values λ are given for room temperature. For instance, the cooling gas can be a pure gas, i.e. a gas consisting of a single gas constituent. Alternatively, the cooling gas can be a gas mixture including at least one gas constituent having a thermal conductivity λ of $\lambda \geq 0.05$ [W/(m*K)]. For example, the cooling gas may include helium (He), in particular 50% helium or more. According to another example, the cooling gas may include hydrogen, for instance at least 5% hydrogen ($H_2$). For instance, the cooling gas may include a mixture of hydrogen and helium. The thermal conductivity λ of pure helium at room temperature is $\lambda_{He}=0.15$ [W/(m*K)]. The thermal conductivity λ of pure hydrogen at room temperature is $\lambda_{H2}=0.18$ [W/(m*K)].

According to some embodiments, which can be combined with any other embodiments described herein, the cooling gas includes a thermal conductivity λ of 0.05 [W/(m*K)] $\leq \lambda \leq 0.20$ [W/(m*K)], particularly a thermal conductivity λ of 0.08 [W/(m*K)]$\leq \lambda \leq 0.18$ [W/(m*K)], more particularly a thermal conductivity λ of 0.10 [W/(m*K)]$\leq \lambda \leq 0.17$ [W/(m*K)].

According to some embodiments, which can be combined with any other embodiments described herein, the cooling gas includes at least 50% helium, particularly the cooling gas includes at least 70% helium, more particularly the cooling gas includes at least 90% helium. For example, the cooling gas may be substantially pure helium, e.g. including at least 99% helium. As another example, the cooling gas may consist of helium, i.e. having a helium content of 100%.

According to some embodiments, which can be combined with any other embodiments described herein, the cooling gas includes at least 5% hydrogen, particularly the cooling gas includes at least 10% hydrogen, more particularly the cooling gas includes at least 15% helium. For example, the hydrogen content in the cooling gas may be 5%$\leq H_2$-content$\leq$90%, particularly 10%$\leq H_2$-content$\leq$75%, more particularly 15%$\leq H_2$-content$\leq$50%.

According to some embodiments, which can be combined with any other embodiments described herein, the cooling gas includes a mixture of helium and hydrogen. In particular, the content of helium in the cooling gas and the content of hydrogen in the cooling gas may add up to 100%. Accordingly, the cooling gas may consist of helium and hydrogen.

Accordingly, by introducing a cooling gas as described herein into the deposition chamber, a faster cooling of the deposition source can be achieved compared to conventional cooling methods.

According to some embodiments, which can be combined with any other embodiments described herein, stopping depositing material from the deposition source can include switching of a crucible heater. Further, stopping depositing material from the deposition source can include closing a valve 230 which is configured to control a flow of the evaporated material from the crucible 210 to the distribution assembly 220.

According to some embodiments, which can be combined with any other embodiments described herein, introducing a cooling gas into the deposition chamber includes introducing the cooling gas into the deposition chamber at a pressure p of 1 mbar≤p≤100 mbar. Providing the cooling gas at a pressure p of 1 mbar≤p≤100 mbar can be beneficial for reducing the cooling time.

According to some embodiments, which can be combined with any other embodiments described herein, the deposition chamber is a "vacuum deposition chamber". In the present disclosure, a "vacuum deposition chamber" can be understood as a chamber configured for vacuum deposition. The term "vacuum", as used herein, can be understood in the sense of a technical vacuum having a vacuum pressure of less than, for example, 10 mbar. Typically, the pressure in a vacuum chamber as described herein may be between $10^{-5}$ mbar and about $10^{-8}$ mbar, more typically between $10^{-5}$ mbar and $10^{-7}$ mbar, and even more typically between about $10^{-6}$ mbar and about $10^{-7}$ mbar. According to some embodiments, the pressure in the vacuum chamber may be considered to be either the partial pressure of the evaporated material within the vacuum chamber or the total pressure (which may approximately be the same when only the evaporated material is present as a component to be deposited in the vacuum chamber). In some embodiments, the total pressure in the vacuum chamber may range from about $10^{-4}$ mbar to about $10^{-7}$ mbar, especially in the case that a second component besides the evaporated material is present in the vacuum chamber (such as a gas or the like).

Figure 2:
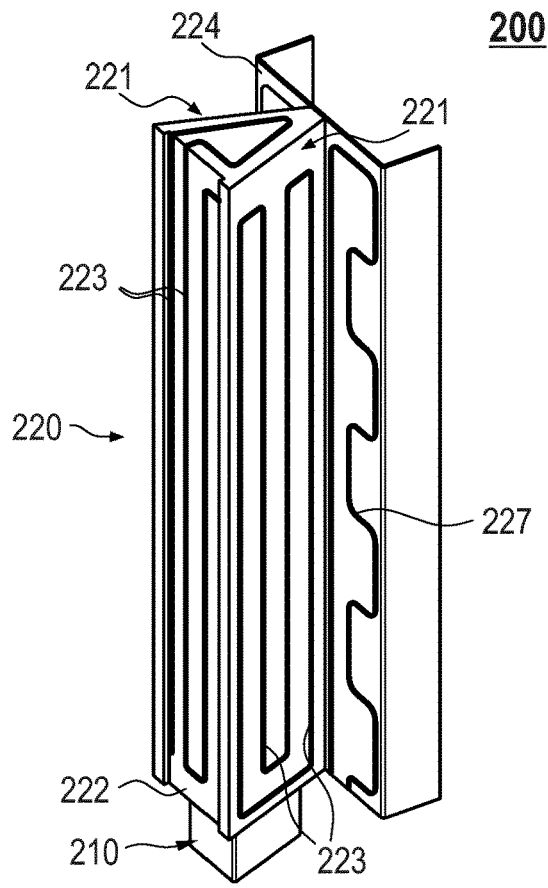
FIG. 2 shows a schematic perspective view of a deposition source according to embodiments described herein.

With exemplary reference to FIG. 2, a deposition source 200 according to embodiments described herein is described. In particular, FIG. 2 shows a schematic perspective view of a deposition source according to some embodiments described herein. Typically, the deposition source 200 includes a distribution assembly 220 which is connected to a crucible 210. For example, the distribution assembly 220 may include a distribution pipe which can be an elongated cube. As exemplarily shown in FIG. 2, the distribution assembly 220 may be designed in a triangular shape. A triangular shape of the distribution assembly can be beneficial in the case that two or more distribution pipes are arranged next to each other, as exemplarily described in more detail with reference to FIG. 4. In particular, a triangular shape of the distribution assembly 220 makes it possible to bring the outlets of neighboring distribution assemblies, e.g. distribution pipes, as close as possible to each other. This allows for achieving an improved mixture of different materials from different distribution pipes, e.g. for the case of the co-evaporation of two, three or even more different materials.

As exemplarily shown in FIG. 2, the distribution assembly 220 may include walls, e.g. side walls 221 and a back side wall 222, such that an inner hollow space is provided inside the distribution assembly. As exemplarily shown in FIG. 4A, a heating unit 223 may be provided for heating the distribution assembly. The heating unit may be mounted or attached to the walls of the distribution assembly. Accordingly, the distribution assembly 220 can be heated to a temperature such that the vapor of the organic material, which is provided by the evaporation crucible, does not condense at an inner portion of the wall of the distribution assembly 220. Further, as exemplarily shown in FIG. 2, the deposition source 200 may include a shielding device 224, particularly a shaper shielding device, to delimit the distribution cone of evaporated material provided to a substrate. In particular, the shielding device may be configured to reduce the heat radiation towards the deposition area. Further, the shielding device may be cooled by a cooling element 227. For example, the cooling element 227 may be mounted to the back side of the shielding device 224 and may include a conduit for cooling fluid.

In the present disclosure, a "deposition source" can be understood as a device or assembly configured for providing a source of material to be deposited on a substrate. In particular, a deposition source 200 may be understood as a device or assembly having a crucible 210 configured to evaporate the material to be deposited and a distribution assembly 220 configured for providing the evaporated material to the substrate 10. Accordingly, the deposition source may also be referred to as evaporation source herein. The expression "a distribution assembly configured for providing the evaporated material to the substrate" may be understood in that the distribution assembly is configured for guiding evaporated or gaseous source material in a deposition direction, as exemplarily indicated in FIG. 1(a) by the plume 226 of evaporated material exiting the one or more outlets 225. Accordingly, the gaseous source material, for example a material for depositing a thin film of an OLED device, is guided within the distribution assembly and exits the distribution assembly through the one or more outlets 225.

In the present disclosure, a "crucible" can be understood as a device having a reservoir for the material to be evaporated by heating the crucible. Accordingly, a "crucible" can be understood as a source material reservoir which can be heated to vaporize the source material into a gas by at least one of evaporation and sublimation of the source material. Typically, the crucible includes a heater to vaporize the source material in the crucible into a gaseous source material. For instance, initially the material to be evaporated can be in the form of a powder. The reservoir can have an inner volume for receiving the source material to be evaporated, e.g. an organic material. For example, the volume of the crucible can be between 100 cm$^3$ and 3000 cm$^3$, particularly between 700 cm$^3$ and 1700 cm$^3$, more particularly 1200 cm$^3$. In particular, the crucible may include a heating unit configured for heating the source material provided in the inner volume of the crucible up to a temperature at which the source material evaporates. For instance, the crucible may be a crucible for evaporating organic materials, e.g. organic materials having an evaporation temperature of about 100° C. to about 600° C.

In the present disclosure, a "distribution assembly" can be understood as an assembly configured for providing evaporated material, particularly a plume of evaporated material, from the distribution assembly to the substrate. For example, the distribution assembly may include a distribution pipe which can be an elongated cube. For instance, a distribution pipe as described herein may provide a line source with a plurality of openings and/or nozzles which are arranged in at least one line along the length of the distribution pipe. For example, the distribution assembly, particularly the distribution pipe, can be made of titanium.

Accordingly, the distribution assembly can be a linear distribution showerhead, for example, having a plurality of openings (or an elongated slit) disposed therein. Further, typically the distribution assembly can have an enclosure, hollow space, or pipe, in which the evaporated material can be provided or guided, for example from the evaporation crucible to the substrate. According to embodiments which can be combined with any other embodiments described herein, the length of the distribution pipe may correspond at least to the height of the substrate to be deposited. In particular, the length of the distribution pipe may be longer than the height of the substrate to be deposited, at least by 10% or even 20%. For example, the length of the distribution pipe can be 1.3 m or above, for example 2.5 m or above. Accordingly, a uniform deposition at the upper end of the substrate and/or the lower end of the substrate can be provided. According to an alternative configuration, the distribution assembly may include one or more point sources which can be arranged along a vertical axis.

Accordingly, a "distribution assembly" as described herein may be configured to provide a line source extending essentially vertically. In the present disclosure, the term "essentially vertically" is understood particularly when referring to the substrate orientation, to allow for a deviation from the vertical direction of 10° or below. This deviation can be provided because a substrate support with some deviation from the vertical orientation might result in a more stable substrate position. Yet, the substrate orientation during deposition of the organic material is considered essentially vertical, which is considered different from the horizontal substrate orientation. Accordingly, the surface of the substrates can be coated by a line source extending in one direction corresponding to one substrate dimension and a translational movement along the other direction corresponding to the other substrate dimension.

Figure 3:
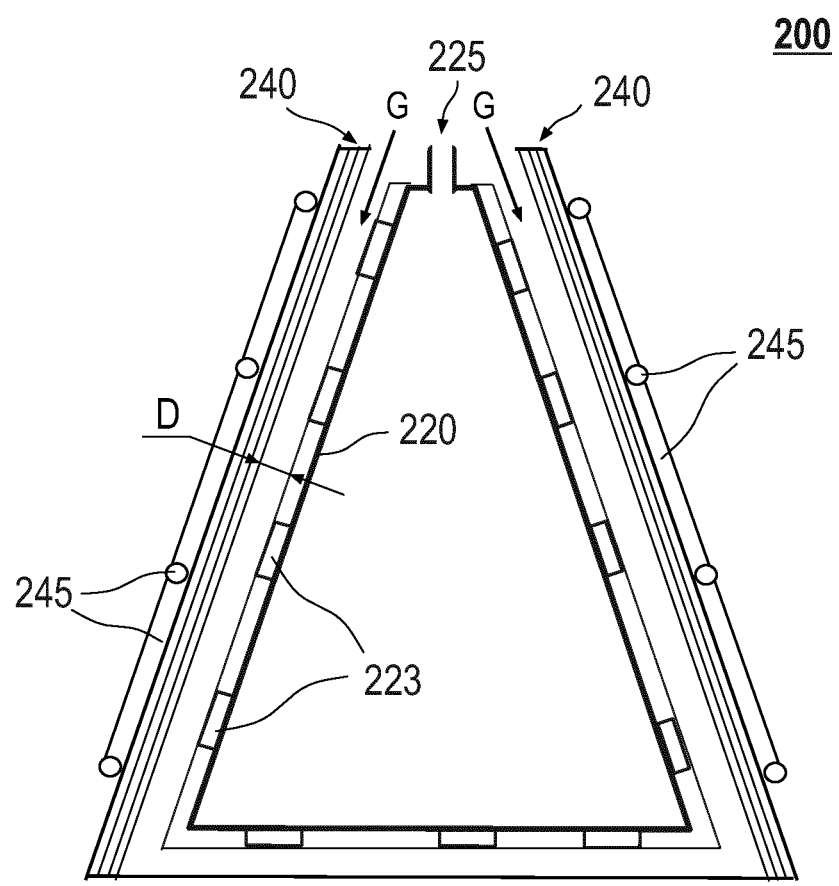
FIG. 3 shows a schematic horizontal sectional view of a deposition source according to embodiments described herein.

FIG. 3 shows a schematic horizontal sectional view of a deposition source according to embodiments described herein. According to some embodiments, which can be combined with any other embodiments described herein, the deposition source 200 includes a distribution assembly 220 and a shield arrangement 240. The shield arrangement 240 can be arranged at a distance D to the distribution assembly for providing a free space between the distribution assembly and the shield arrangement. For instance, the distance D of the shield arrangement to the distribution assembly can be 4 mm≤D≤20 mm.

With exemplary reference to FIG. 3, according to some embodiments which can be combined with any other embodiments described herein, the method of cooling a deposition source further includes providing the cooling gas G into the free space between the distribution assembly 220 and the shield arrangement 240. Accordingly, a heat transfer from the distribution assembly 220 to the shield arrangement 240 can be increased which beneficially results in a faster cooling of the distribution assembly.

As exemplarily shown in FIG. 3, the shield arrangement may include a stack of shield plates. For instance, the stack of shield plates may include two or more shield plates. In particular, the two or more shield plates can be configured for reflecting heat energy provided by the heating unit 223 back towards the hollow space of the distribution assembly 220. For example, the shield plates can have thicknesses of 0.1 mm to 3 mm. Further, the material of the shield plates can be selected from at least one material selected from the group consisting of ferrous or non-ferrous material, for example at least one material selected from the group consisting of copper (Cu), aluminum (Al), copper alloy, aluminum alloy, brass, iron, titanium (Ti), ceramic and other suitable materials.

According to some embodiments, which can be combined with any other embodiments described herein, the two or more shield plates can be stacked with a spacing S of 0.1 mm≤S≤1.0 mm, e.g. the spacing between neighboring shield plates can be 0.3 mm.

As exemplarily shown in FIG. 3, according to some embodiments which can be combined with any other embodiments described herein, the deposition source may include a cooling system 245 being in contact with the shield arrangement 240. Accordingly, the method of cooling a deposition source as described herein may further include cooling the shield arrangement 240 by using a cooling system 245 being in contact with the shield arrangement. For instance, the cooling system 245 can be a water cooled cooling system. Alternatively, other suitable cooling fluids such as liquid nitrogen or the like may be used.

Accordingly, by providing the cooling gas G into the free space between the distribution assembly 220 and the shield arrangement 240 while cooling the shield arrangement 240 by using the cooling system 245, the heat transfer from the distribution assembly 220 to the shield arrangement 240 can be increased which beneficially results in a faster cooling of the distribution assembly. This is because advantageously the heat transfer from the distribution assembly to the cooled shield arrangement can take place via conduction and convection. In particular, beneficially a cooling time of 1 hour or less for cooling from an operation temperature of 500° C. to 600° C. down to a temperature of approximately 100° C. can be provided.

Figure 4:
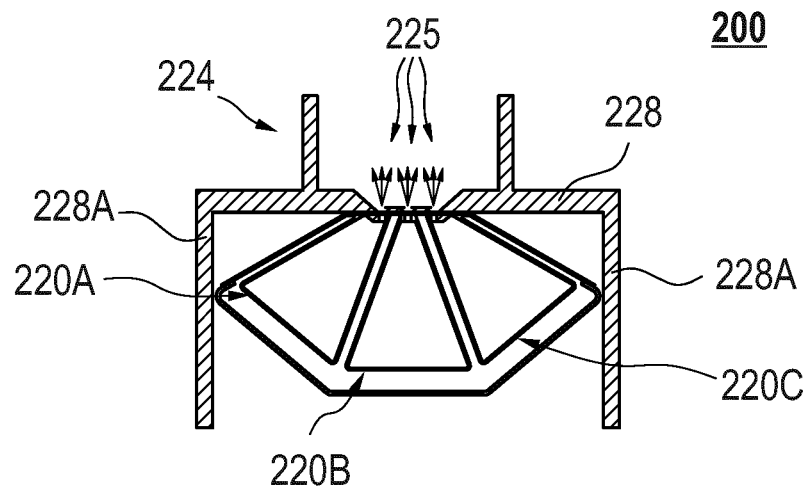
FIG. 4 shows a schematic horizontal sectional view of a deposition source according to further embodiments described herein.

FIG. 4 shows a schematic horizontal sectional view of a deposition source according to further embodiments described herein. In particular, FIG. 4 shows a cross-sectional top view of a deposition source 200 including a first distribution assembly 220A, a second distribution assembly 220B, and a third distribution assembly 220C. Accordingly, by providing three corresponding evaporation crucibles, a material deposition arrangement may be provided as an evaporation source array, e.g. wherein more than one kind of material can be evaporated at the same time.

In particular, as exemplarily shown in FIG. 4, according to embodiments which can be combined with any other embodiments described herein, the first distribution assembly 220A, the second distribution assembly 220B, and the third distribution assembly 220C can be configured as a distribution pipe having a substantially triangular cross-section perpendicular to the length of the distribution pipes. A deposition source having three distribution assemblies may also be referred to as triple source.

With exemplary reference to FIG. 4, the triple source may be provided with a cooling shield 228. The cooling shield 228 may include sidewalls 228A which are arranged such that a U-shaped cooling shield is provided in order to reduce the heat radiation towards the deposition area, i.e. a substrate. For example, the cooling shield can be provided as metal plates having conduits for cooling fluid, such as water, attached thereto or provided therein. Additionally, or alternatively, thermoelectric cooling devices or other cooling devices can be provided to cool the cooled shields.

In FIG. 4, for illustrative purposes, evaporated source material exiting the outlets 225 of the distribution assemblies are indicated by arrows. Due to the essentially triangular shape of the distribution assemblies, the evaporation cones originating from the three distribution assemblies are in close proximity to each other, such that mixing of the source material from the different distribution assemblies can be improved. In particular, the shape of the cross-section of the distribution pipes allow to place the outlets or nozzles of neighboring distribution pipes close to each other.

According to some embodiments, which can be combined with other embodiments described herein, a first outlet or nozzle of the first distribution assemblies and a second outlet or nozzle of the second distribution assemblies can have a distance of 50 mm or below, e.g. 30 mm or below, or 25 mm or below, such as from 5 mm to 25 mm. More specifically, the distance of the first outlet or nozzle to a second outlet or nozzle can be 10 mm or below.

As further shown in FIG. 4, a shielding device 224, particularly a shaper shielding device, can be provided, for example, attached to the cooling shield 228 or as a part of the cooling shield. By providing shaper shields, the direction of the vapor exiting the distribution pipe or pipes through the outlets can be controlled, i.e. the angle of the vapor emission can be reduced. According to some embodiments, at least a portion of evaporated material provided through the outlets or nozzles is blocked by the shaper shield. Accordingly, the width of the emission angle can be controlled.

Figure 5:
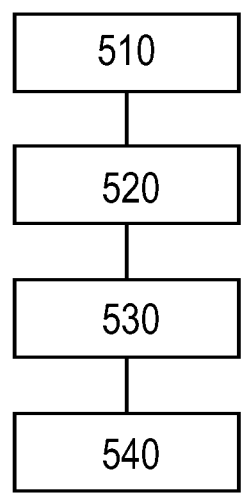
FIG. 5 shows a flowchart for illustrating a method of cooling an evaporation source according to embodiments described herein.

With exemplary reference to the flowchart shown in FIG. 5, a method 500 of cooling an evaporation source according to the present disclosure is described. The evaporation source is provided in a deposition chamber. According to embodiments, which can be combined with any other embodiments described herein, the method of cooling the evaporation source includes switching off (block 510) a crucible heater of a crucible configured for evaporating material. In particular, the crucible heater is switched off and left to cool until no more evaporation occurs. Additionally, the method includes maintaining (block 520) a heating of a distribution assembly of the evaporation source until material evaporation has stopped. Maintaining the heating of the distribution assembly can be beneficial for avoiding condensation of evaporated material in the distribution assembly. Accordingly, advantageously blocking of the one or more outlets can be avoided. Once evaporation has stopped, the heating of the distribution assembly can be switched off. Typically, the distribution assembly is in fluid communication with the crucible.

Further, the method 500 includes introducing a cooling gas into the deposition chamber, particularly at a pressure p of 1 mbar≤p≤100 mbar. The cooling gas includes a thermal conductivity λ of λ≥0.05 [W/(m*K)]. In particular, the introduction of the cooling gas into the deposition chamber may be carried out once evaporation has stopped and the tube heaters have been switched off. For example, introducing the cooling gas into the deposition chamber may include venting the deposition chamber using a cooling gas of 1 mbar-100 mbar. For instance, the cooling gas can be a helium gas, a helium gas mixture, hydrogen gas, or a hydrogen gas mixture.

Additionally, the method 500 includes providing (block 530) the cooling gas into a free space between the distribution assembly and a shield arrangement. As exemplarily described with reference to FIG. 3, the shield arrangement is arranged at a distance D to the to the distribution assembly for providing the free space. Furthermore, the method 500 includes cooling (block 540) the shield arrangement by using a cooling system being in contact with the shield arrangement.

Accordingly, embodiments of the method of cooling an evaporation source as described herein beneficially provide for a significant reduction in cooling time compared to conventionally known methods. In particular, it is to be noted that before the deposition chamber can be vented with air and opened to the environment, the deposition source should be cooled below 100° C. The time needed for cooling the deposition source directly affects the available production time, i.e. the longer the cooling time the shorter the available production time. The embodiment described herein beneficially reduces the cool down time of a deposition source and increases the available production time, e.g. for OLED production.

Figure 6:
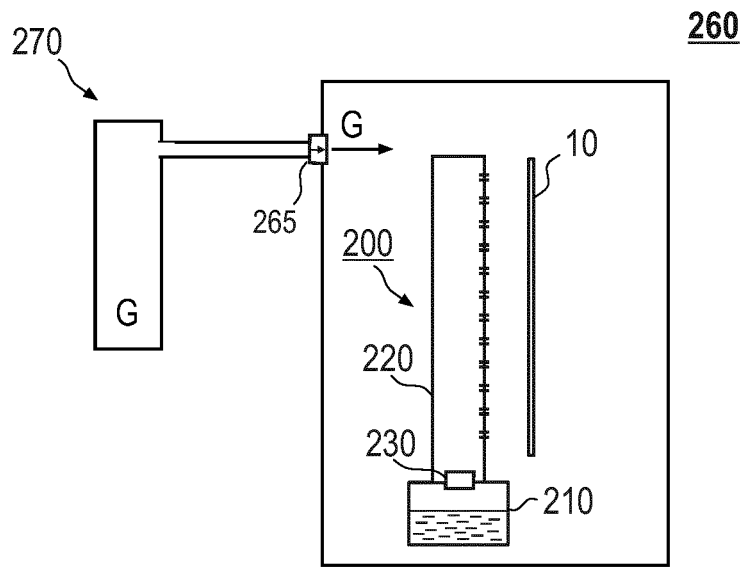
FIG. 6 shows a schematic view of a chamber for cooling a deposition source according to embodiments described herein.

With exemplary reference to FIG. 6, a chamber 260 for cooling a deposition source 200 according the present disclosure is described. According to embodiments which can be combined with any other embodiments described herein, the chamber 260 for cooling a deposition source includes a deposition source 200 being arranged in the chamber 260 for cooling the deposition source. Further, the chamber 260 for cooling the deposition source includes a cooling gas supply system 270 configured for providing a cooling gas into the chamber 260 for cooling the deposition source. For instance, the chamber 260 for cooling the deposition source can be a deposition chamber 250 as described herein. The cooling gas supply system 270 can be configured to provide the cooling gas at a pressure p of 1 mbar≤p≤100 mbar. Typically, the cooling gas is a cooling gas as described herein, particularly a cooling gas including a thermal conductivity λ of λ≥0.05 [W/(m*K)]. As exemplarily shown in FIG. 6, a cooling gas introduction valve 265 may be provided in a wall of the chamber 260 for cooling the deposition source.

According to embodiments which can be combined with any other embodiments described herein, the deposition source provided in the chamber 260 for cooling the deposition source includes a distribution assembly and a shield arrangement, as exemplarily described with reference to FIGS. 2 and 3. Typically, the shield arrangement is arranged at a distance D to the distribution assembly for providing a free space between the distribution assembly and the shield arrangement. Further, the shield arrangement may include a cooling system for cooling the shield arrangement, as described in more detail with reference to FIG. 3.

Accordingly, compared to conventional cooling chambers, the embodiments of the chamber for cooling a deposition source as described herein beneficially provide for a reduction of cooling time of the deposition source.

Figure 7:
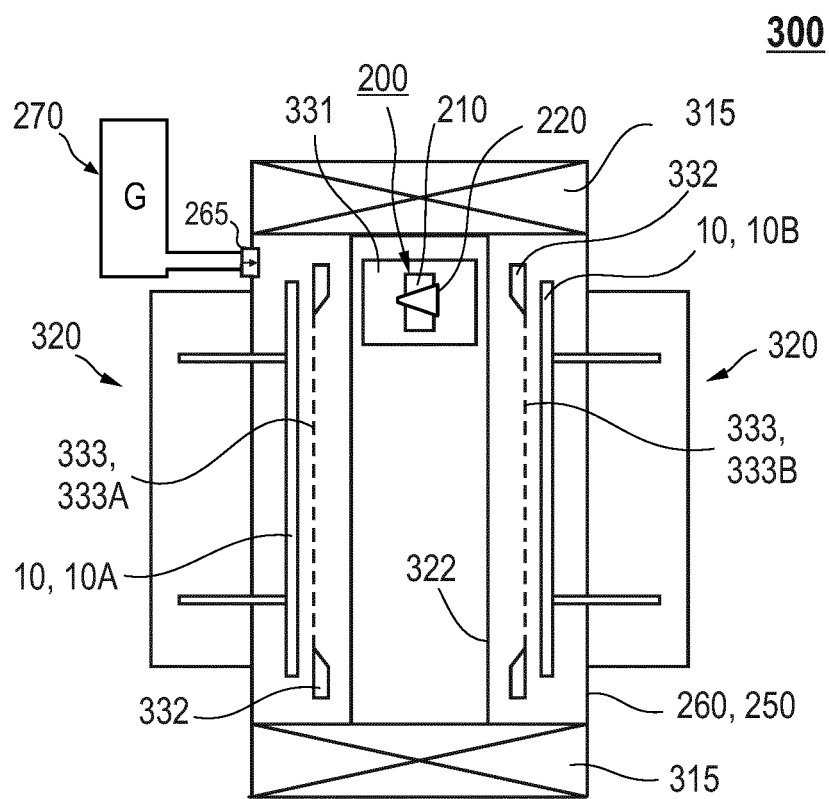
FIG. 7 shows a schematic view of a deposition system for depositing a layer on a substrate according to embodiments described herein.

With exemplary reference to FIG. 7, a deposition system 300 for depositing a layer on a substrate according to the present disclosure is described. According to embodiments which can be combined with any other embodiments described herein, the deposition system 300 includes a chamber 260 for cooling a deposition source 200 according any of the embodiments described herein. In the embodiment of the deposition system 300 as shown in FIG. 7, the chamber 260 for cooling the deposition source 200 is a deposition chamber 250, particularly a vacuum deposition chamber. Further, deposition system 300 includes a deposition source 200 according to any of the embodiments described herein in the vacuum deposition chamber and a substrate support 320 configured for supporting a substrate 10 during material deposition.

Further, as exemplarily shown in FIG. 7, the deposition source 200 can be provided on a track or linear guide 322. The linear guide 322 may be configured for the translational movement of the deposition source 200. Further, a drive for providing a translational movement of the deposition source 200 can be provided. In particular, a transportation apparatus for contactless transportation of the material deposition arrangement source may be provided in the vacuum deposition chamber. As exemplarily shown in FIG. 7, the deposition chamber 250 may have gate valves 315 via which the vacuum deposition chamber can be connected to an adjacent routing module or an adjacent service module. Typically, the routing module is configured to transport the substrate to a further vacuum deposition system for further processing and the service module is configured for maintenance of the deposition source. In particular, the gate valves allow for a vacuum seal to an adjacent vacuum chamber, e.g. of the adjacent routing module or the adjacent service module, and can be opened and closed for moving a substrate and/or a mask into or out of the vacuum deposition system.

With exemplary reference to FIG. 7, according to embodiments which can be combined with any other embodiments described herein, two substrates, e.g. a first substrate 10A and a second substrate 10B, can be supported on respective transportation tracks within the deposition chamber 250. Further, two tracks for providing masks 333 thereon can be provided. In particular, the tracks for transportation of a substrate carrier and/or a mask carrier may be provided with a further transportation apparatus for contactless transportation of the carriers.

Typically, coating of the substrates may include masking the substrates by respective masks, e.g. by an edge exclusion mask or by a shadow mask. According to typical embodiments, the masks, e.g. a first mask 333A corresponding to a first substrate 10A and a second mask 333B corresponding to a second substrate 10B, are provided in a mask frame 332 to hold the respective mask in a predetermined position, as exemplarily shown in FIG. 7.

As shown in FIG. 7, the linear guide 322 provides a direction of the translational movement of the deposition source 200. On both sides of the deposition source 200, a mask 333, e.g. a first mask 333A for masking a first substrate 10A and second mask 333B for masking a second substrate 10B, can be provided. The masks can extend essentially parallel to the direction of the translational movement of the deposition source 200. Further, the substrates at the opposing sides of the deposition source can also extend essentially parallel to the direction of the translational movement.

With exemplary reference to FIG. 7, a source support 331 configured for the translational movement of the deposition source 200 along the linear guide 322 may be provided. Typically, the source support 331 supports the crucible 210 and a distribution assembly 220 provided over the evaporation crucible, as schematically shown in FIG. 7. Accordingly, the vapor generated in the evaporation crucible can move upwardly and out of the one or more outlets of the distribution assembly. Accordingly, as described herein, the distribution assembly is configured for providing evaporated material, particularly a plume of evaporated organic material, from the distribution assembly 220 to the substrate 10.

In view of the embodiments described herein, it is to be understood that the present disclosure provides for improved cooling methods for a deposition source, improved chambers for cooling a deposition source and improved deposition systems with which a reduction of cooling time of a deposition source can be achieved resulting in a higher productivity.

While the foregoing is directed to embodiments, other and further embodiments may be devised without departing from the basic scope, and the scope is determined by the claims that follow.

In particular, this written description uses examples to disclose the disclosure, including the best mode, and also to enable any person skilled in the art to practice the described subject-matter, including making and using any devices or systems and performing any incorporated methods. While various specific embodiments have been disclosed in the foregoing, mutually non-exclusive features of the embodiments described above may be combined with each other. The patentable scope is defined by the claims, and other examples are intended to be within the scope of the claims if the claims have structural elements that do not differ from the literal language of the claims, or if the claims include equivalent structural elements with insubstantial differences from the literal language of the claims.

The invention claimed is:

1. A method of cooling a deposition source, comprising: stopping depositing material from the deposition source, the deposition source being arranged in a deposition chamber, wherein the deposition source comprises a distribution assembly, and a shield arrangement, the shield arrangement being arranged at a distance D to the distribution assembly for providing a free space between the distribution assembly and the shield arrangement, wherein the distance D of the shield arrangement to the distribution assembly is 4 mm<D<20 mm,
   introducing a cooling gas into the deposition chamber at a pressure p of 1 mbar≤p≤100 mbar, the cooling gas comprising a thermal conductivity λ of λ≥0.05 [W/(m*K)],
   guiding a cooling gas through the distribution assembly, the distribution assembly comprising a first distribution assembly, a second distribution assembly, and a third distribution assembly each configured as a distribution pipe having a substantially triangular cross-section, and
   providing the cooling gas into the free space between the distribution assembly and the shield arrangement.

2. The method of claim 1, wherein the cooling gas comprises at least 50% helium.

3. The method of claim 1, wherein the cooling gas comprises at least 5% hydrogen.

4. The method of claim 1, further comprising cooling the shield arrangement by using a cooling system being in contact with the shield arrangement.

5. The method of claim 1, wherein the shield arrangement comprises a stack of shield plates.

6. The method of claim 5, wherein the stack of shield plates comprises two or more shield plates which are stacked with a spacing S of 0.1 mm≤S≤1.0 mm.

7. The method of claim 1, wherein the deposition source is an evaporation source configured for depositing evaporated material on a substrate.

8. The method of claim 1, wherein the deposition source is an evaporation source configured for depositing evaporated organic material on a substrate.

9. A method of cooling an evaporation source provided in a deposition chamber, the method comprising:
   switching off a crucible heater of a crucible configured for evaporating material; maintaining a heating of a distribution assembly of the evaporation source until material evaporation has stopped, the distribution assembly being in fluid communication with the crucible;
   guiding a cooling gas through the distribution assembly, the distribution assembly comprising a first distribution assembly, a second distribution assembly, and a third distribution assembly each configured as a distribution pipe having a substantially triangular cross-section;
   introducing a cooling gas into the deposition chamber at a pressure p of 1 mbar<p<100 mbar, the cooling gas comprising a thermal conductivity λ of λ>0.05 [W/(m*K)];
   providing the cooling gas into a free space between the distribution assembly and a shield arrangement, the shield arrangement being arranged at a distance D to the distribution assembly for providing the free space, wherein the distance D of the shield arrangement to the distribution assembly is 4 mm<D<20 mm; and cooling the shield arrangement by using a cooling system being in contact with the shield arrangement.

\* \* \* \* \*